US009559098B2

(12) United States Patent
Iwata

(10) Patent No.: US 9,559,098 B2
(45) Date of Patent: Jan. 31, 2017

(54) SEMICONDUCTOR DEVICE INCLUDING VOLTAGE DIVIDING DIODE

(71) Applicant: FUJI ELECTRIC CO., LTD., Kawasaki-shi (JP)

(72) Inventor: Hideki Iwata, Nagano (JP)

(73) Assignee: FUJI ELECTRIC CO, Ltd., Kawasaki-Shi (JP)

(*) Notice: Subject to any disclaimer, the term of this patent is extended or adjusted under 35 U.S.C. 154(b) by 215 days.

(21) Appl. No.: 14/450,472

(22) Filed: Aug. 4, 2014

(65) Prior Publication Data
US 2015/0061627 A1    Mar. 5, 2015

(30) Foreign Application Priority Data

Sep. 5, 2013    (JP) ................. 2013-183695

(51) Int. Cl.
*H02M 3/158*    (2006.01)
*H01L 27/088*    (2006.01)
*H02M 1/32*    (2007.01)
*H02M 3/156*    (2006.01)

(52) U.S. Cl.
CPC ......... *H01L 27/088* (2013.01); *H01L 27/0883* (2013.01); *H02M 1/32* (2013.01); *H02M 3/156* (2013.01); *H02M 3/158* (2013.01); *H02M 3/1588* (2013.01)

(58) Field of Classification Search
CPC .... H02M 3/156; H02M 3/158; H02M 3/1588; H02M 1/32
See application file for complete search history.

(56) References Cited

U.S. PATENT DOCUMENTS

| 5,912,496 | A | * | 6/1999 | Ohashi | ................ H01L 27/0251 257/355 |
| 6,181,186 | B1 | | 1/2001 | Itoh et al. | |
| 8,972,158 | B2 | * | 3/2015 | Miyazawa | ............ F02P 3/0552 123/623 |
| 2005/0068707 | A1 | * | 3/2005 | Takada | ............... H03K 17/0822 361/103 |
| 2011/0279152 | A1 | * | 11/2011 | Nakahara | ............ H01L 27/0623 327/110 |
| 2015/0263491 | A1 | * | 9/2015 | Miyazawa | ............... H01T 15/00 315/209 T |

FOREIGN PATENT DOCUMENTS

| JP | 2000-012853 A | 1/2000 |
| JP | 2010-110093 A | 5/2010 |
| JP | 2011-239242 A | 11/2011 |

* cited by examiner

*Primary Examiner* — Jue Zhang
*Assistant Examiner* — Lakaisha Jackson
(74) *Attorney, Agent, or Firm* — Rossi, Kimms & McDowell LLP

(57) ABSTRACT

In a semiconductor device connected to a mutual-inductive load, a voltage dividing diode is provided in series to an ST-MOS circuit so that an anode thereof is connected to a GND terminal and a cathode thereof is connected to the back gate of each of lateral nMOSFETs forming the ST-MOS circuit. This can inhibit parasitic transistors in the lateral nMOSFETs from malfunctioning to enable the voltage at an ST terminal to be reliably maintained at a normal voltage.

14 Claims, 14 Drawing Sheets

SEMICONDUCTOR DEVICE INCLUDING VOLTAGE DIVIDING DIODE

CROSS-REFERENCE TO RELATED APPLICATION

This application claims priority from and the benefit of Japanese Application No. 2013-183695, filed Sep. 5, 2013, the entire disclosure of which is incorporated herein by reference.

BACKGROUND OF THE INVENTION

Field of the Invention

Embodiments of the present invention relate to a semiconductor device with power semiconductor elements, controlling a load current flowing in a mutual-inductive load such as a stepping motor, and an integrated circuit, detecting an abnormality in the load for protecting the power semiconductor elements, being integrated in the same semiconductor substrate.

Background

FIG. 7A is a diagram showing the whole configuration of the principal part of a stepping motor. FIG. 7B is a diagram showing the arrangement of a rotor 97 and coils 90 of the stepping motor. The stepping motor is provided with the rotor 97 and the four coils 90 (91 to 94) for rotating the rotor 97. As is shown in FIG. 7A, control circuits 501a to 501d are provided with their respective output stage nMOSFETs 51a to 51d. The output stage nMOSFETs 51a to 51d carry out control of currents flowing in the coils 91 to 94 connected thereto, respectively. In addition, the output stage nMOSFETs 51a to 51d have their respective parasitic diodes (shown without reference numerals) connected in parallel thereto. Furthermore, the control circuits 501a to 501d are provided with their respective various kinds of detection circuits (an overheating detection circuit and an overcurrent detection circuit etc.) and protection circuits (not shown). In addition, a battery B as a power supply becomes necessary.

As is shown in FIG. 7B, the four coils 91 to 94 are arranged around the rotor 97. The two opposed coils 91 and 93 are wound around one core 95 of iron, for example, to be iron-core coils having mutual inductance. Similarly, the two opposed coils 92 and 94 are wound around one core 96 of iron to be iron-core coils having mutual inductance. Thus, each of the iron-core coils 91 and 93 is referred to as a mutual-inductive load, and each of the iron-core coils 92 and 94 is also referred to as a mutual-inductive load. The output stage nMOSFETs 51a and 51c, connected to the two (a pair of the) coils 91 and 93, respectively, wound onto the one core 95, mutually carry out complementary operations (operations carried out between two so that when one is turned-on, the other is turned-off). Moreover, the output stage nMOSFETs 51b and 51d, connected to the two (a pair of the) coils 92 and 94, respectively, wound onto the one core 96, also mutually carry out complementary operations. The four coils 91 to 94 are arranged around the rotor 97 to give a rotating force to the rotor 97.

The one coil 90 and the one output stage nMOSFET 51 of the one control circuit 501 form one arm. Here, the reference numeral 90 is that used when the coils 91 to 93 are generally named, the reference numeral 50 is that used when the output stage nMOSFETs 51a to 51d are generally named, and the reference numeral 501 is that used when the control circuits 501a to 501d are generally named.

The stepping motor is controlled by four arms of first arm to fourth arm. In each of the first arm to the fourth arm, through its own one of the coils 91 to 94 as the mutual-inductive loads, a load current flows. Each arm is provided with one control circuit 501. The stepping motor provided with the arms is used for, for example, exhaust gas recirculation of a vehicle etc. Hence, in the following, each of the arms is referred to as an EGR. The term EGR is an abbreviation of Exhaust Gas Recirculation. Here, the first arm to the fourth arm are referred to as EGR1 to EGR4, respectively, and are formed with the coil 91 to the coil 94 and the output stage nMOSFET 51a to the output stage nMOSFET 51d, respectively.

The control circuit 501 has four terminals of an IN terminal (IN) as an input terminal, an OUT terminal (OUT) as an output terminal, an ST terminal (ST) as a status terminal (state output terminal), and a GND terminal (GND) as a grounding terminal.

FIG. 8 is a block diagram showing the first arm EGR1 and the third arm EGR3 shown in FIG. 7A with the configurations thereof being made simplified. When the first arm EGR1 is turned-off and the third arm EGR3 is turned-on, in a transient state immediately thereafter, a current flows in a path shown by arrows in dotted lines in the direction of charging the battery B through the parasitic diode (shown without reference numeral) connected in parallel to the output stage nMOSFET 51c shown in FIG. 7A due to the induced electromotive force generated in the iron-core coil 93 as the mutual-inductive load. At this time, the polarity of an OUT3 terminal becomes negative. Thereafter, when the state becomes a steady state, a steady current flows in the iron-core coil 93 (inductive load) through the output stage nMOSFET 51c in the third arm EGR3 already in the turned-on state. Here, the control circuits 501a and 501c of semiconductor devices 500a and 500c explained later, respectively, are driven by signals from a timing generator.

FIG. 9 is a detailed circuit diagram of the control circuit 501 (501a to 501d) shown in FIG. 7A. The circuit configurations of all of the control circuits 501a to 501d are identical. The control circuit 501 is provided with voltage dividing resistors 64 and 65 dividing the voltage at the OUT terminal and the output stage nMOSFET 51 formed of an nMOSFET section 52 and a parasitic diode section 53. In addition, the control circuit 501 is provided with a dynamic clamp Zener diode 54 connected between the drain 52b and the gate 52a of the output stage nMOSFET 51. The dynamic clamp Zener diode 54 is formed of Zener diodes 54a and 54b in inverse-series connection to each other.

The control circuit 501 is provided with an nMOSFET 55a that is connected to the gate 52a of the output stage nMOSFET 51 to form a gate charge extracting circuit at protecting operation 55 that will be explained later. Further, the control circuit 501 is provided with a resistor 63 connected to the drain (shown without reference numeral) of the nMOSFET 55a and a gate charge extracting circuit at normal operation 56 connected to the resistor 63 and is formed of a constant current source 56a (depletion MOSFET 56b). In addition, the control circuit 501 is provided with a logic circuit 57 connected to a connection point 63a of the constant current source 56a and the resistor 63 and connected to each of an overheat detection circuit 59 and an overcurrent detection circuit 60.

To the ST terminal, a Zener diode 66b and an nMOSFET 58a, which is provided for detecting a state whether the load is normally connected or abnormally disconnected due to a break in a wire etc. (broken wire detection), are connected. To the ST terminal, an ST-MOS circuit 58 is further connected which is formed of an nMOSFET 58b transmitting an abnormal signal to the ST terminal when the abnormal signal is outputted from the logic circuit 57.

Moreover, the IN terminal is connected to the cathode of a Zener diode 66c and the logic circuit 57, the GND terminal is connected to the source of each of the nMOSFETs, and the OUT terminal is connected to the drain of the output stage nMOSFET 51 and the voltage dividing resistors 64 and 65.

The ST-MOS circuit 58 detects a break in a wire as follows. When no abnormality occurs in the load (coil 90), the turning-off of the output stage nMOSFET 51 increases the voltage at the OUT terminal connected to the battery B through the load. This increases the voltage taken out from the connection point of the two resistors in the voltage dividing resistors 65 to turn-on the nMOSFET 58a. Since the drain electrode of the nMOSFET 58a is connected to the ST terminal, a state detection signal when no abnormality occurs (under a normal condition) is outputted to the ST terminal.

While, when a break such as burnout of the load (coil 90) connected to the OUT terminal or disengagement of a connector occurs, the load is disconnected from the OUT terminal, by which the voltage of the battery B is held at the section of the load. This causes no increase in the voltage at the OUT terminal and also causes no increase in the voltage taken out from the connection point of the two resistors of the voltage dividing resistors 65 and given to the gate of the nMOSFET 58a through the lead of a broken wire detection line 69. At this time, the nMOSFET 58a is kept in a turned-off state, by which a state detection signal representing a broken state in which the load is disconnected can be outputted from the ST terminal.

In the same ST-MOS circuit 58, the operation of the nMOSFET 58b connected in parallel to the nMOSFET 58a is as follows. When the logic circuit 57 detects an abnormal state such as the overheating or the overcurrent of the nMOSFET 51, the logic circuit 57 outputs an abnormal signal (high logic level, H) to the gate electrode of the nMOSFET 58b. This makes the nMOSFET 58b turned-on, by which a state detection signal (abnormal signal) is outputted to the ST terminal.

To the ST terminal, an unillustrated control device (microcomputer etc.) is externally connected. The control device makes a decision as to whether the load connected to the OUT terminal is in a state without abnormality or in any one of abnormal states described in the foregoing by combining the logical value of the gate signal to the output stage nMOSFET 51, which signal is outputted from the timing generator shown in FIG. 8, and the logical value of the signal outputted from the ST terminal.

FIG. 10 is a cross sectional view showing the principal part of a related semiconductor device 500 (500a to 500b) with the control circuit 501 (501a to 501d) shown in FIG. 6 formed on an n-type semiconductor substrate 70. All of the circuit configurations of the control circuits 501a to 501d in their respective semiconductor devices 500a to 500d are identical. The battery B forming the control circuit 501 is externally provided.

The semiconductor device 500 is provided with the vertical output stage nMOSFET 51. In the semiconductor device 500, a plurality of p-type well regions 71, 73 and 76 are also formed in the surface layer of the n-type semiconductor substrate 70. The semiconductor device 500 is provided with the logic circuit 57, the overheat detection circuit 59 (not shown), and the overcurrent detection circuit 60 (not shown), which are formed in the surface layer of the p-type well region 76 as one of a plurality of the foregoing p-type well regions. In the surface layer of the p-type well region 76, the lateral nMOSFET 55a in the gate charge extracting circuit at protecting operation 55 and the gate charge extracting circuit at normal operation 56 are further provided.

As an n$^+$-type region connected to the GND wiring, an n-type source region 72 (source 52c) of the output stage nMOSFET 51 is provided in the surface layer of the p-type well region 71 as another one of the p-type well regions. Further, an n-type cathode region 74 of the Zener diode 54a (formed in the n-type semiconductor substrate 70) forming the dynamic clamp Zener diode 54 is provided in the surface layer of the p-type well region 73 as the remaining one of the p-type well regions. In addition, an n$^+$-type region 75 is provided which is formed in the surface layer of the n-type semiconductor substrate 70 and is connected to the ground GND.

The ST terminal (ST) is connected to an n-type drain region 79 of the lateral nMOSFET 58b, formed in the p-type well region 76 to form the ST-MOS circuit 58, through a resistor 67e. The IN terminal (IN) is connected to the gate 52a of the output stage nMOSFET 51 through the resistors 67b, 63, and 67a by gate wiring 68. The OUT terminal (OUT) is connected to an electrode formed on the whole bottom surface of the n-type semiconductor substrate 70. The electrode formed on the whole bottom surface of the n-type semiconductor substrate 70 becomes the drain electrode of the output stage nMOSFET 51.

The GND terminal (GND) is connected to the n-type source region (shown without reference numeral) of the lateral nMOSFET 55a forming the gate charge extracting circuit at protecting operation 55. The GND terminal is also connected to an n-type source region 78 of the depletion MOSFET 56b to be the constant current source 56a forming the gate charge extracting circuit at normal operation 56. The GND terminal is further connected to the n-type source region (shown without reference numeral) of a lateral nMOSFETs 57a in the logic circuit 57, to the n-type source region (shown without reference numeral) of the nMOSFET 58b (58a) having the n-type drain region 79 connected to the ST terminal (ST), and to the p-type well region 76.

In addition, the n-type drain region (shown without reference numeral) of the lateral nMOSFET 55a and the n-type drain region 77 of the depletion MOSFET 56b are connected to the gate wiring 68. Moreover, a Zener diode 81 for surge protection connected between the IN terminal and the GND terminal and a Zener diode 82 connected between the GND terminal and the ST terminal are provided.

Both of the p-type well region 71 and the n-type source region 72 (source 52c) of the output stage nMOSFET 51 are also connected to the GND terminal. With the p-type well region 71 and the n-type semiconductor substrate 70, the parasitic diode section 53 of the output stage nMOSFET 51 is formed.

The overheat detection circuit 59, the overcurrent detection circuit 60, the logic circuit 57, the gate charge extracting circuit at protecting operation 55, and the gate charge extracting circuit at normal operation 56, all of which are shown in FIG. 9, are formed in the p-type well region 76 shown in FIG. 10 with each being kept at specified distances away from one another to be self-isolated.

FIG. 11 is a waveform diagram showing the waveforms of input voltages VIN1 to VIN 4 to the first arm EGR1 to the fourth arm EGR4, respectively, shown in FIG. 7A.

The phases of the input voltage VIN1 to the first arm EGR1, the input voltage VIN2 to the second arm EGR2, the input voltage VIN3 to the third arm EGR3, and the input voltage VIN4 to the fourth arm EGR4, respectively, have delays by a time one-half of the pulse width of the input voltage VIN for each thereof. The input voltage VIN is transmitted to the gate wiring 68 to become the gate voltage of the output stage nMOSFET 51. When the input voltage VIN is at an H level, a load current flows in the output stage nMOSFET 51 of the arm EGR to bring the arm EGR into a turned-on state. With the first arm EGR1 to the fourth arm EGR4 brought into turned-on states in order, the rotor 97 is rotated, by which the stepping motor formed of the coils 90 and the rotor 97 carries out a rotary operation. By the rotary operation of the stepping motor, the opening and closing of a valve (not shown) is carried out which is provided in a flow path through which an exhaust gas of a vehicle flows, for example, by which the recirculation of the exhaust gas is carried out.

The output stage nMOSFET 51a forming the first arm EGR1 and the output stage nMOSFET 53a forming the third arm EGR3 carry out complementary operations in which when one is in a turned-on state, the other one is in a turned-off state. That is, the operations of the first arm EGR1 and the third arm EGR3 are complementary to each other. Thus, the time at the falling of the input voltage VIN1 of the first arm EGR1 becomes the time at the rising of the input voltage VIN3 of the third arm EGR3 (at the time of C). The second arm EGR2 and the fourth arm EGR4 also carry out similar complementary operations.

FIG. 12 is a waveform diagram showing the waveforms of the input voltage VIN3, a voltage VST3, a voltage VOUT3, and a current IOUT3 in the control circuit 501c of the third arm EGR3, and the waveforms of the input voltage VIN1, a voltage VST1, a voltage VOUT1, and a current IOUT1 in the control circuit 501a of the first arm EGR1. Here, the input voltage represented by the sign VIN is an input voltage (also referred to as a gate voltage or a control voltage) to the IN terminal as an input terminal represented by the sign IN, the voltage represented by the sign VST is a voltage at the ST terminal as a status terminal represented by the sign ST, the voltage represented by the sign VOUT is a voltage at an OUT terminal as an output terminal represented by the sign OUT and the drain voltage of an output stage nMOSFET 51, and the current represented by the sign IOUT is a current flowing at the OUT terminal, that is, a drain current flowing in the output stage nMOSFET 51. The current IOUT is also a load current flowing in the coil 90 (mutual-inductive load) in the arm EGR.

As is shown in FIG. 12, suppose that a turning-on signal is inputted as the input voltage VIN3, and a turning-off signal is inputted as the input voltage VIN1 at the time $t_0$. Then, the output stage nMOSFET 51a in the first arm EGR1 is made turned-off to bring the current IOUT1 to become zero at the time $t_1$ after a time delay due to the presence of a Miller capacitance and to bring the voltage VOUT1 to be the voltage of the battery B as a power supply voltage. At the time $t_1$ at which the state of the output stage nMOSFET 51a in the first arm EGR1 is changed from the turned-on state to the turned-off state, the state of the output stage nMOSFET 51c in the third arm EGR3 is shifted from the turned-off state to the turned-on state. This makes the voltage VOUT3 fall. In the process after the time $t_1$, due to the influence of the mutual inductance between the coil 93 in the third arm EGR3 and the coil 91 in the first arm EGR1, a current (reverse current) flows in the coil 93 in the third arm EGR3 in the opposite direction from the ground GND toward the battery B. The reverse current lasts for a period determined by the value of the mutual inductance and thereafter, at the time $t_2$ at which the forward current exceeds the reverse current, the current flowing in the third arm EGR3 is switched to a current flowing from the battery B to the ground GND (forward current). The reverse current charges the battery B as a regenerative current.

For preventing the influence of the reverse current explained in the foregoing, a free wheeling diode is sometimes provided for a mutual-inductive load. Moreover, a semiconductor device disclosed in JP-A-2010-110093 is provided with a power semiconductor element for carrying out switching control of a load device and a semiconductor integrated circuit detecting an abnormality of the load device. The semiconductor device further contains a voltage dividing circuit for pulling down, which divides the voltage at the output terminal of a power semiconductor element by resistors for pulling down arranged in series, a MOSFET fed with a power supply voltage from the voltage dividing circuit to detect the disconnection of the load device and a MOSFET carrying out a turning-on or turning-off operation according to an abnormal signal outputted from the semiconductor integrated circuit. In addition, the semiconductor device is provided with a status output terminal outputting the result of the detection of the disconnected state of the load device to the outside. With the configuration, a semiconductor device can be provided to detect a disconnected state of a load in a load driving system. For the load device in this case, a self-inductive load such as a solenoid or a coil is intended to be used.

In JP-A-2000-12853, a semiconductor device is described which has a first switching means turning-on and turning-off a current being made to flow in a load, a current detecting means detecting the current flowing in the load, a second switching means carrying out turning-off and turning-on for opening and closing, respectively, the connection between the current detecting means and the load, and a controlling means controlling the second switching means and the first switching means. In the semiconductor device, the controlling means turns-on the first switching means before turning-on the second switching means at start-up of driving the load and the current detecting means turns-off only the first switching means when an overcurrent is detected. Furthermore, it is described that the configuration can provide a semiconductor device that makes the semiconductor element reliably and quickly turned-off at the short circuit of the load to protect the semiconductor element from the short circuit of the load. Also in this case, a self-inductive load such as a solenoid or a coil is intended to be used.

In JP-A-2011-239242, it is described that when the potential of the ground GND becomes higher than the potential of the output of the semiconductor device due to the reverse current from an inductive load, a voltage is supplied from the drain of a depletion MOSFET always made turned-on to the back gate of a MOSFET so that no parasitic transistor of the MOSFET is made turned-on. In this case, a mutual-inductive load such as a stepping motor is intended to be used.

FIG. 13A is a cross sectional view of the semiconductor device 500c in the third arm EGR3 showing paths P1 and P2 of reverse currents flowing in the semiconductor device 500c with the nMOSFET 51c being turned-on in the turned-off period of the output stage nMOSFET 51a in the first arm EGR1. In the period between the time $t_1$ and the time $t_2$ shown in FIG. 12, reverse currents due to an induced electromotive force (counter electromotive force) generated by the presence of the mutual inductance between the coil 93 in the third arm EGR3 and the coil 91 in the first arm EGR1 flow in the semiconductor device 500c. A path P1 passing through the parasitic diode section 53 of the output stage nMOSFET 51c and a path P2 passing through the n-type semiconductor substrate 70 from the p-type well region 76 become the paths of the reverse currents flowing in the semiconductor device 500*c* in the third arm EGR3.

While, on the surface of the p-type well region 76, a plurality of n⁺-type regions are formed, a part of which are connected to an IN3 terminal through the gate wiring 68 or to an ST3 terminal through the resistor 67*e*. A part of the n⁺-type regions (n-type collector regions) form a parasitic transistor 88 together with the p-type well region 76 (p-type base region) and the n-type semiconductor substrate 70 (n-type emitter region). FIG. 13B is a schematic cross sectional view showing the operation of the parasitic transistors 88. By the induced electromotive force (counter electromotive force) generated in the coil 93, a forward bias voltage is applied to the p-n junction between the p-type well region 76 connected to the GND terminal at approximately 0V and the n-type semiconductor substrate 70 connected to the OUT3 terminal, by which a reverse current flows from the GND3 terminal to the OUT3 terminal. In this case, a voltage drop V1 is produced at the OUT3 terminal to the GND terminal by, for example, −0.6V which is a built-in potential difference (Vbi) at the p-n junction between the p-type well region 76 and the n-type semiconductor substrate 70. This makes holes injected from the p-type well region 76 to the n-type semiconductor substrate 70 as is shown in FIG. 13B.

Moreover, at the forward-biased p-n junction, electrons are injected from the n-type semiconductor substrate 70 to the p-type well region 76. To the IN3 terminal, a positive voltage of some kind is applied with respect to the GND3 terminal. Hence, a reverse bias voltage is applied to the p-n junction between the n⁺-type region connected to the IN3 terminal and the p-type well region 76. This allows a part of electrons injected into the p-type well region 76 (p-type base region) to reach the n⁺-type region connected to the IN3 terminal though the density of the injected electrons is being reduced. With the electrons reaching the n⁺-type region in this way, the collector current Inpn of the parasitic transistor 88 is to flow from the IN3 terminal to the OUT3 terminal.

Although the ST3 terminal has no voltage applied thereto unlike the IN3 terminal, electrons reach to an n⁺-type region connected to the ST3 terminal in the same way as that of the electrons to the IN3 terminal. This allows the collector current Inpn to flow from the ST3 terminal to the OUT3 terminal. By the collector current Inpn from the ST3 terminal, the voltage at the ST3 terminal becomes equal to the voltage of the n-type semiconductor substrate 70. Thus, in the period in which the reverse current flows, the level of the voltage at the ST3 terminal becomes an L level equal to the level of the n-type semiconductor substrate 70. In this way, the voltage at the ST3 terminal, coming to be at the L level in the period during which the voltage is originally to be at a high level, causes a microcomputer (MC), to which the voltage at the ST3 terminal is inputted, to perform an erroneous detection.

Moreover, the provision of the free wheeling diodes, as described in the foregoing, causes the number of components to increase to result in a high cost. Furthermore, in each of the semiconductor devices disclosed in JP-A-2010-110093 and JP-A-2000-12853, respectively, a self-inductive load is intended to be used. Therefore, no description is given with respect to the erroneous operation of a parasitic transistor caused when the polarity of the OUT terminal becomes negative in the previously described power semiconductor device connected to the mutual-inductive load.

In addition, in the semiconductor device disclosed in JP-A-2011-239242, the operation of the parasitic transistor in the depletion MOSFET is liable to become unstable when the distribution in the impurity concentration varies in the p-type well region, for example. Thus, when the parasitic transistor in the depletion MOSFET performs no operation, a parasitic transistor in a MOSFET, to which a self-diagnostic output is inputted, is erroneously operated to make it impossible to always maintain the voltage at the DIAG terminal (equivalent to the ST terminal) at a normal voltage.

SUMMARY OF THE INVENTION

Embodiments of the invention provide a semiconductor device that is connected to a mutual-inductive load and is capable of inhibiting erroneous operations of parasitic transistors formed in the semiconductor device and reliably maintaining the voltage at the ST terminal at a normal voltage.

In an embodiment of the invention, a semiconductor device is provided as a semiconductor device provided with a control circuit including an output stage switching element controlling a current flowing in a load having a mutual inductance, a detection circuit detecting an abnormality of the output stage switching element, a logic circuit making a decision with respect to the state of the output stage switching element by the output of the detection circuit, a status detection circuit outputting the status of the connection between the load and the output stage switching element and the result of the decision made by the logic circuit to a state outputting terminal, and a voltage dividing diode connected in series to the status detection circuit with the cathode thereof connected to the status detection circuit and with the anode thereof connected to the ground.

In an embodiment, the output stage switching element is connected to an output terminal of the control circuit with the high potential side thereof, and the load is connected to the output terminal with one end thereof and is connected to the high potential side of a power supply with the other end thereof, the low potential side of the power supply being connected to the ground of the control circuit.

In an embodiment, the semiconductor device has a configuration in which the output stage switching element is formed in the surface layer of a semiconductor layer of a second conduction type with the semiconductor layer taken as being on the high potential side of the output stage switching element, the detection circuit and the logic circuit are formed in a first well region of a first conduction type formed in the surface layer of the semiconductor layer of the second conduction type, the status detection circuit is formed of a lateral MOSFET of the second conduction type formed in a second well region of the first conduction type, the second well region being formed in the surface layer of the semiconductor layer of the second conduction type at a distance from the first well region of the first conduction type, each of the first well region of the first conduction type and the low potential side of the output stage switching element is connected to the ground of the power supply, the second well region of the first conduction type forms a back gate of the lateral MOSFET of the second conduction type, the back gate having the cathode of the voltage dividing diode connected thereto to connect the second well region of the first conduction type to the ground of the power supply through the anode of the voltage dividing diode, and the semiconductor layer of the second conduction type formed as being on the high potential side of the output stage switching element is connected to the high potential side of the power supply through the load connected to the output terminal of the control circuit.

In an embodiment, a forward bias voltage applied to a first p-n junction between the first well region and the semiconductor layer is equal to a sum of a voltage applied to a second p-n junction in the voltage dividing diode and a voltage applied to a third p-n junction between the second well region and the semiconductor layer.

In an embodiment, the voltage applied to the second p-n junction is made to be smaller than the built-in voltage at the second p-n junction. Moreover, in an embodiment, the voltage applied to the third p-n junction is made to be smaller than the built-in voltage at the third p-n junction.

In an embodiment, the isolation distance between the first well region and the second well region is made to be between 10 µm and 500 µm. Moreover, in an embodiment, the voltage dividing diode is formed on an oxide film formed on the semiconductor layer.

In an embodiment, the oxide film is formed on a third well region of the first conduction type formed in the surface layer of the semiconductor layer so as to be isolated from both of the first well region and the second well region. Moreover, in an embodiment, each of the isolation distance between the first well region and the third well region and the isolation distance between the second well region and the third well region is between 10 µm and 500 µm.

In an embodiment, the output stage switching element is a vertical MOSFET of the second conduction type. Moreover, in an embodiment, the isolation distance between the first well region and the second well region is longer than the diffusion length of minor carriers injected from the first well region to the semiconductor layer.

In an embodiment, the isolation distance between the second well region and the third well region is longer than the diffusion length of minor carriers injected from the first well region to the semiconductor layer. Moreover, in an embodiment, the voltage dividing diode is formed of polysilicon.

In an embodiment, the voltage dividing diode is a lateral diffused junction diode, and the lateral diffused junction diode is formed in the surface layer of a third well region of the first conduction type formed with a depth greater than the diffused depth of the first well region, with an impurity concentration higher than that in the first well region, and at a distance apart from the first well region and the second well region.

In addition, in an embodiment, a fourth well region of the first conduction type is formed in the second well region so as to overlap at least a source region of regions forming the lateral MOSFET of the second conduction type forming the status detection circuit formed in the second well region of the first conduction type, the fourth well region having a diffusion depth greater than that of the second well region and an impurity concentration higher than that in the second well region, and being connected to the cathode of the voltage dividing diode.

According to embodiments of the invention, in a semiconductor device connected to a mutual-inductive load, the anode of a diode is connected to a GND terminal of the ground and the cathode is connected to the back gate of the lateral nMOSFET forming the ST-MOS circuit as a status detection circuit. This can inhibit a parasitic transistor in the lateral nMOSFET from being erroneously operated to enable the voltage at the ST terminal as the output terminal of the ST-MOS circuit to be reliably maintained at a normal voltage.

BRIEF DESCRIPTION OF THE DRAWINGS

FIG. 4A is a cross sectional view of the semiconductor device 100c illustrating the case when the output stage nMOSFET 1a in the first arm EGR1 is turned-off and the output stage nMOSFET 1c in the third arm EGR3 is turned-on.

DESCRIPTION OF THE ILLUSTRATED EMBODIMENTS

Figure 1:
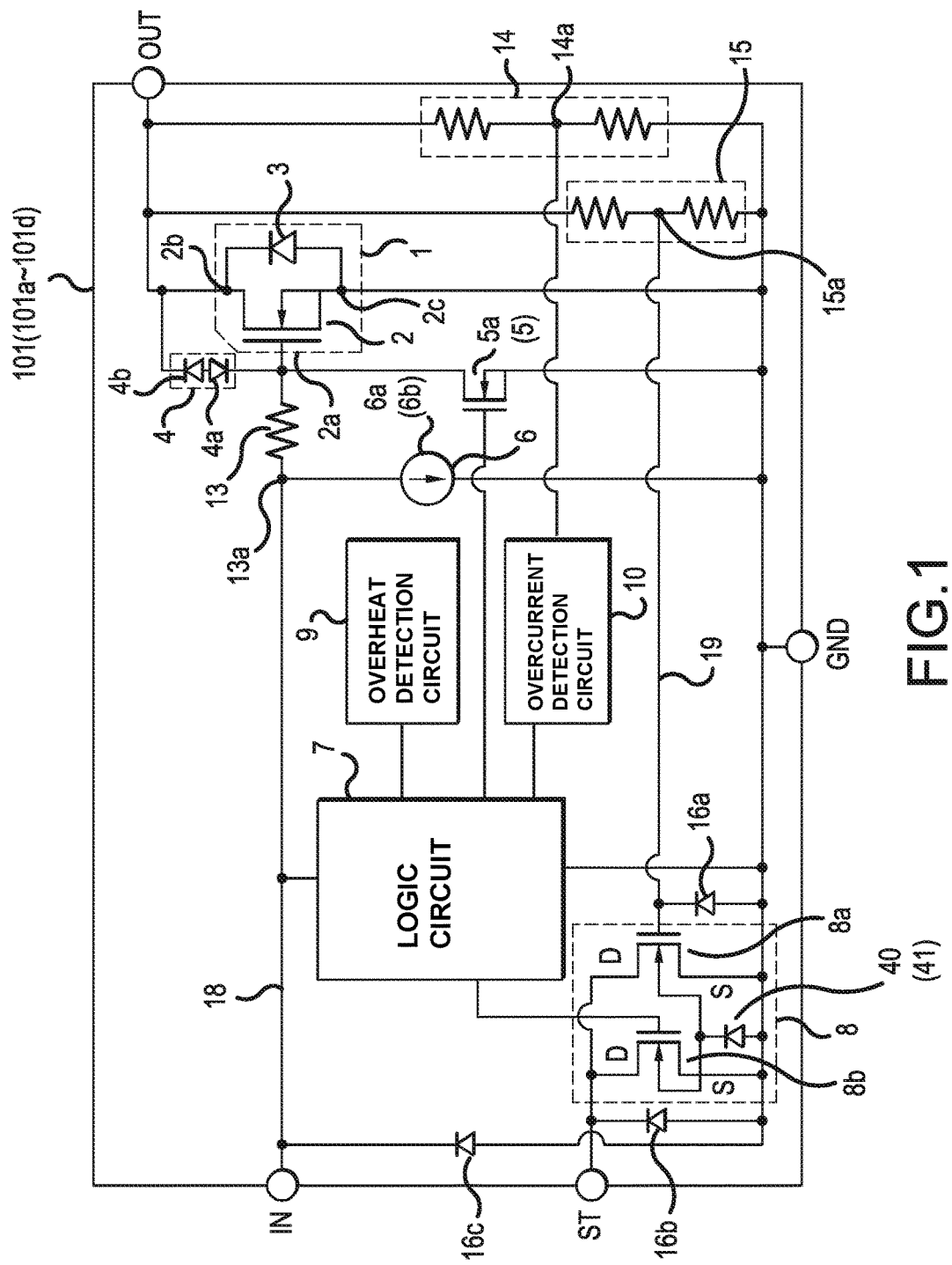
FIG. 1 is a circuit diagram showing the principal part of a control circuit 101 using a semiconductor device 100 or 200 according to an embodiment of the invention.

FIG. 1 is a circuit diagram showing the principal part of a control circuit 101 (101a to 101d) using a semiconductor device 100 or 200 according to an embodiment of the invention.

The control circuit 101 is provided with voltage dividing resistors 14 and 15 dividing the voltage at an OUT terminal and an output stage nMOSFET 1 formed of an nMOSFET section 2 and a parasitic diode section 3. In addition, the control circuit 101 is provided with a dynamic clamp Zener diode 4 connected between the drain 2b and the gate 2a of the output stage nMOSFET 1. The dynamic clamp Zener diode 4 is formed of Zener diodes 4a and 4b in inverse-series connection to each other. The control circuit 101 represents each of the control circuit 101a, control circuit 101b, control circuit 101c, and control circuit 101d provided in the first arm EGR1, second arm EGR2, third arm EGR3, and fourth arm EGR4, respectively.

The control circuit 101 is provided with an nMOSFET 5a that is connected to the gate 2a of the output stage nMOSFET 1 to form a gate charge extracting circuit at protecting operation 5. Further, the control circuit 101 is provided with a resistor 13 connected to the drain (shown without reference numeral) of the nMOSFET 5a and a gate charge extracting circuit at normal operation 6 connected to the resistor 13 and is formed of a constant current source 6a.

In addition, the control circuit 101 is provided with a logic circuit 7 connected to a connection point 13a of a depletion MOSFET 6b to be the constant current source 6a and the resistor 13 and connected to each of an overheat detection circuit 9 and an overcurrent detection circuit 10. The overcurrent detection is carried out by connecting the lead of a detection line taken out from a connection point 14a of the voltage dividing resistors 14 to the overcurrent detection circuit 10.

Figure 9:
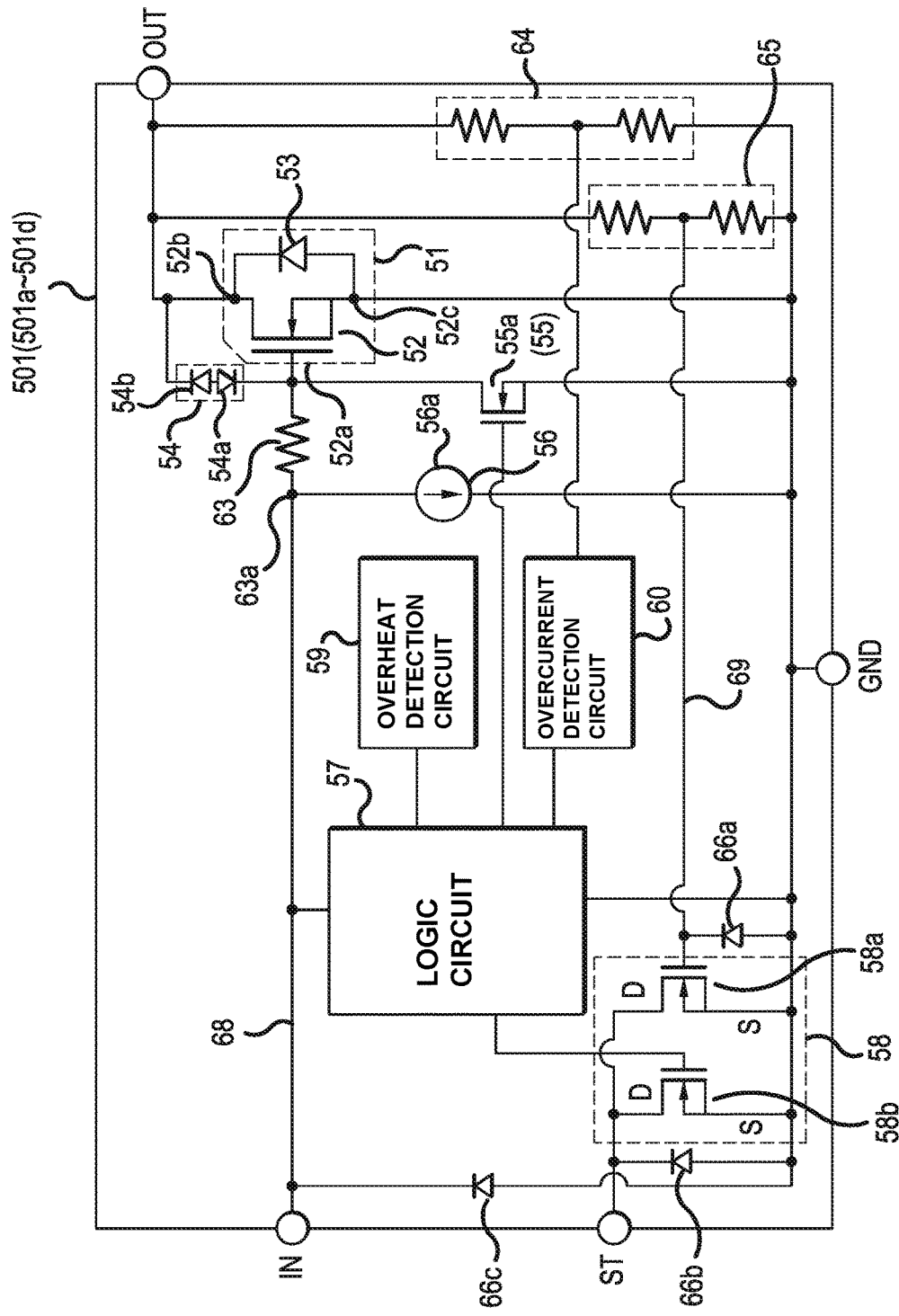
FIG. 9 is a detailed circuit diagram of the control circuit 501 shown in FIG. 7A.
Figure 10:
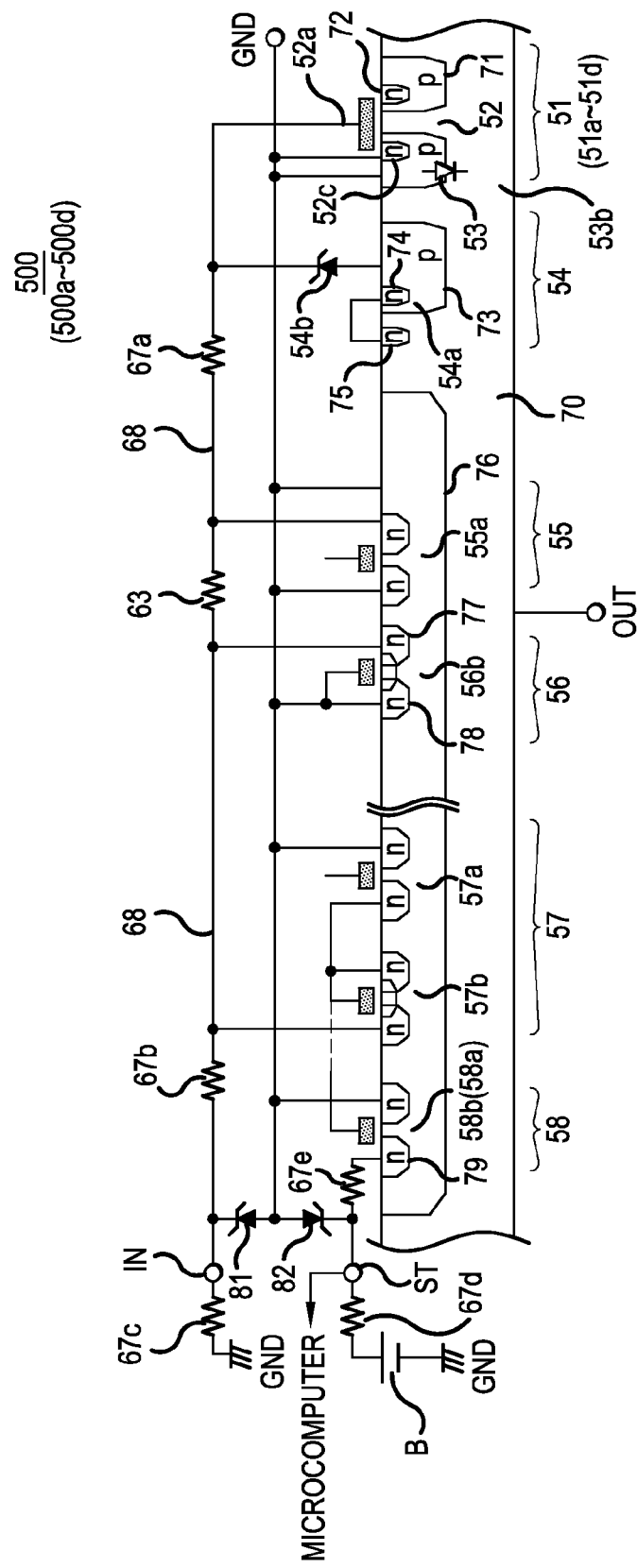
FIG. 10 is a cross sectional view showing the principal part of the related semiconductor device 500 with the control circuit 501 shown in FIG. 9 formed on an n-type semiconductor substrate 70.
Figure 11:
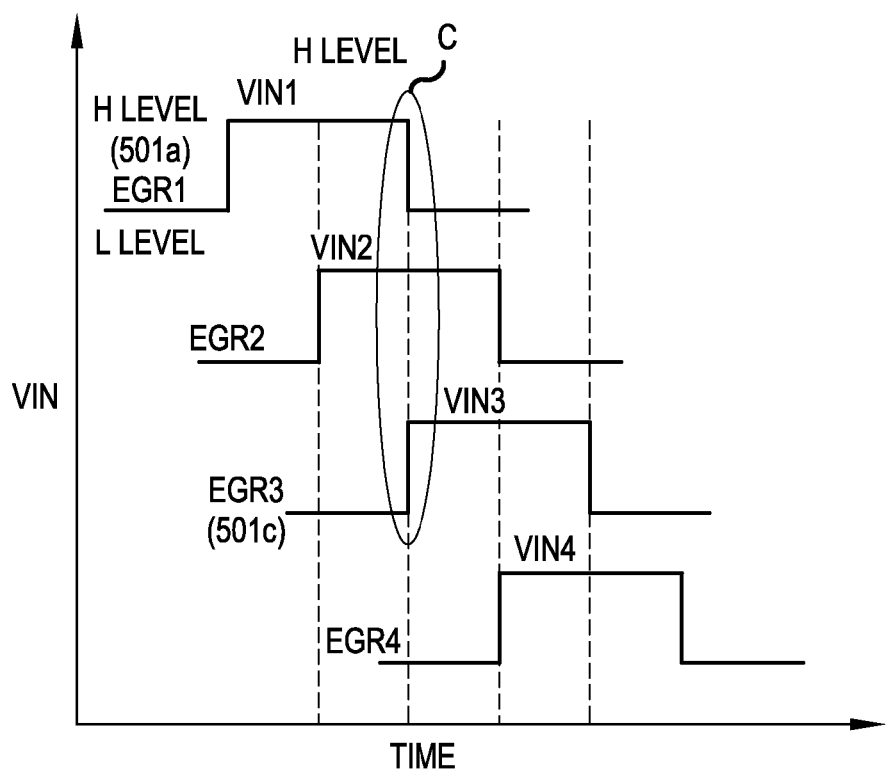
FIG. 11 is a waveform diagram showing the waveforms of input voltages VIN1 to VIN 4 to the first arm EGR1 to the fourth arm EGR4, respectively, shown in FIG. 7A.
Figure 12:
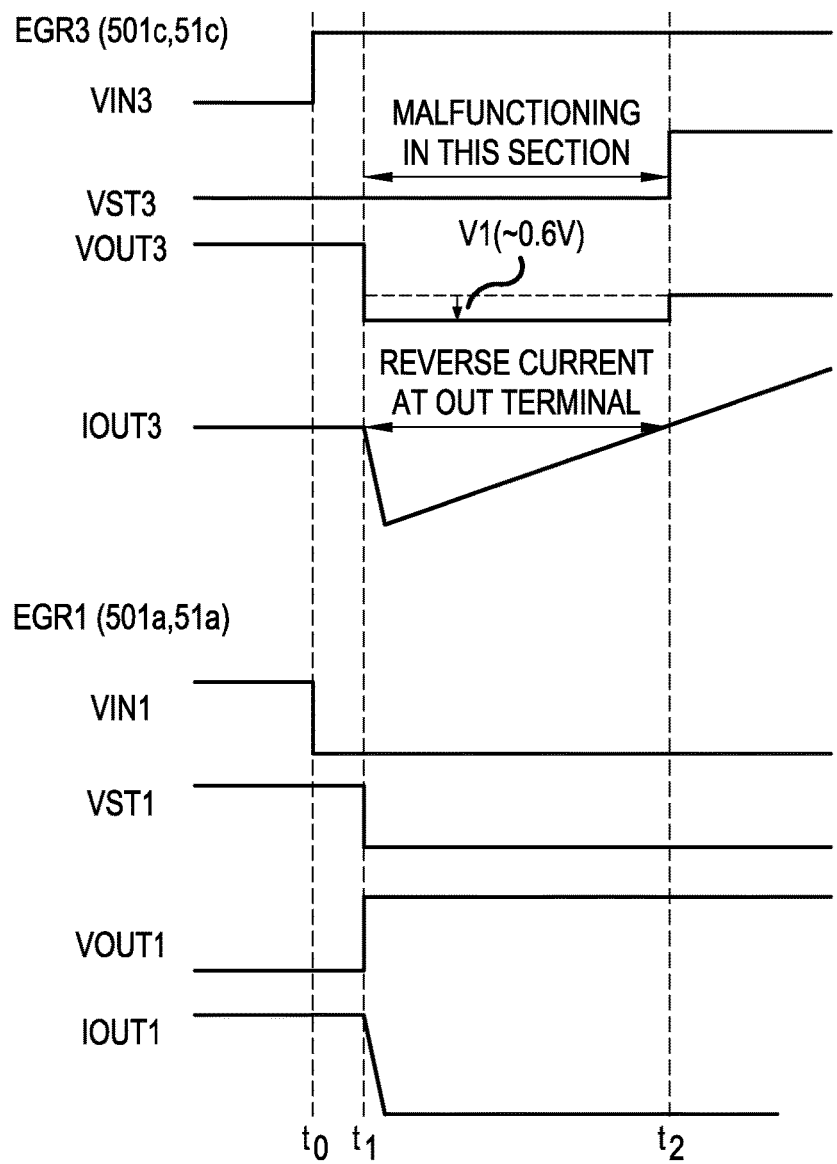
FIG. 12 is a waveform diagram showing the waveforms of the input voltage VIN3, a voltage VST3, a voltage VOUT3, and a current IOUT3 in the control circuit 501c of the third arm EGR3 and the waveforms of the input voltage VIN1, a voltage VST1, a voltage VOUT1, and a current IOUT1 in the control circuit 501a in the first arm EGR1.
Figure 13A:
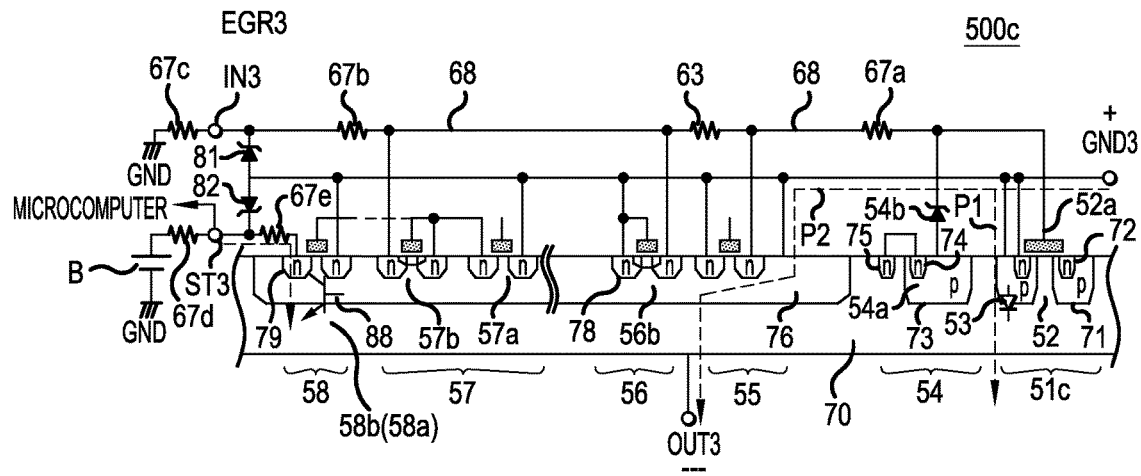
FIG. 13A is a cross sectional view of the semiconductor device 500c in the third arm EGR3 showing paths P1 and P 2 of reverse currents flowing in the semiconductor device 500c with the nMOSFET 51c being turned-on in the turned-off period of the output stage nMOSFET 51a in the first arm EGR1.
Figure 13B:
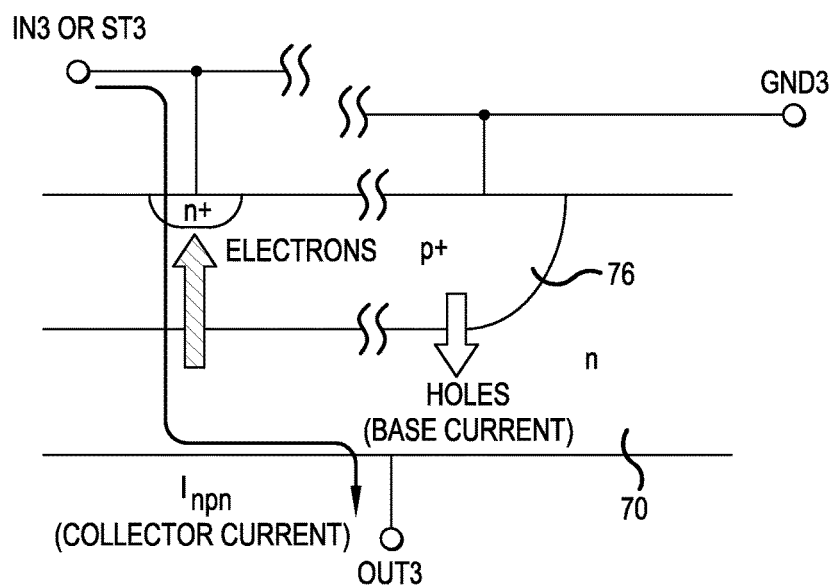
FIG. 13B is a schematic cross sectional view showing the operation of a parasitic transistor.

To an ST terminal, a Zener diode 16b and a lateral nMOSFET 8a, which is provided for detecting a state whether the load is normally connected or abnormally disconnected due to a break in a wire etc. (broken wire detection), are connected. The broken wire detection is carried out with the same configuration as that is shown in foregoing FIG. 9 by connecting the lead of a broken wire detection line 19 taken out from a connection point 15a of the voltage dividing resistors 15 to the gate of the lateral nMOSFET 8a. To the ST terminal, a lateral nMOSFET 8b is further connected which transmits an abnormal signal to the ST terminal when the abnormal signal is outputted from the logic circuit 7. The abnormal detection is also carried out with the same configuration as that is shown in foregoing FIG. 9. In this way, the control circuit 101 is provided with an ST-MOS circuit 8 formed of the lateral nMOSFETs 8a and 8b.

Moreover, the control circuit 101 is provided with an IN terminal connected to the cathode of a Zener diode 16c and the logic circuit 7, a GND terminal connected to the source of each of the nMOSFETs, and the OUT terminal connected to the drain of the output stage nMOSFET 1 and the voltage dividing resistors 14 and 15.

To the back gates of the lateral nMOSFET 8a and the lateral nMOSFET 8b forming the ST-MOS circuit 8, a voltage dividing diode 40 is connected in series with the anode thereof connected to the GND terminal.

Semiconductor devices according to embodiments of the invention will be specifically explained below. In the following, a first conduction type is shown by the p-type and a second conduction type is shown by the n-type. This, however, may be reversed in some cases.

Figure 2:
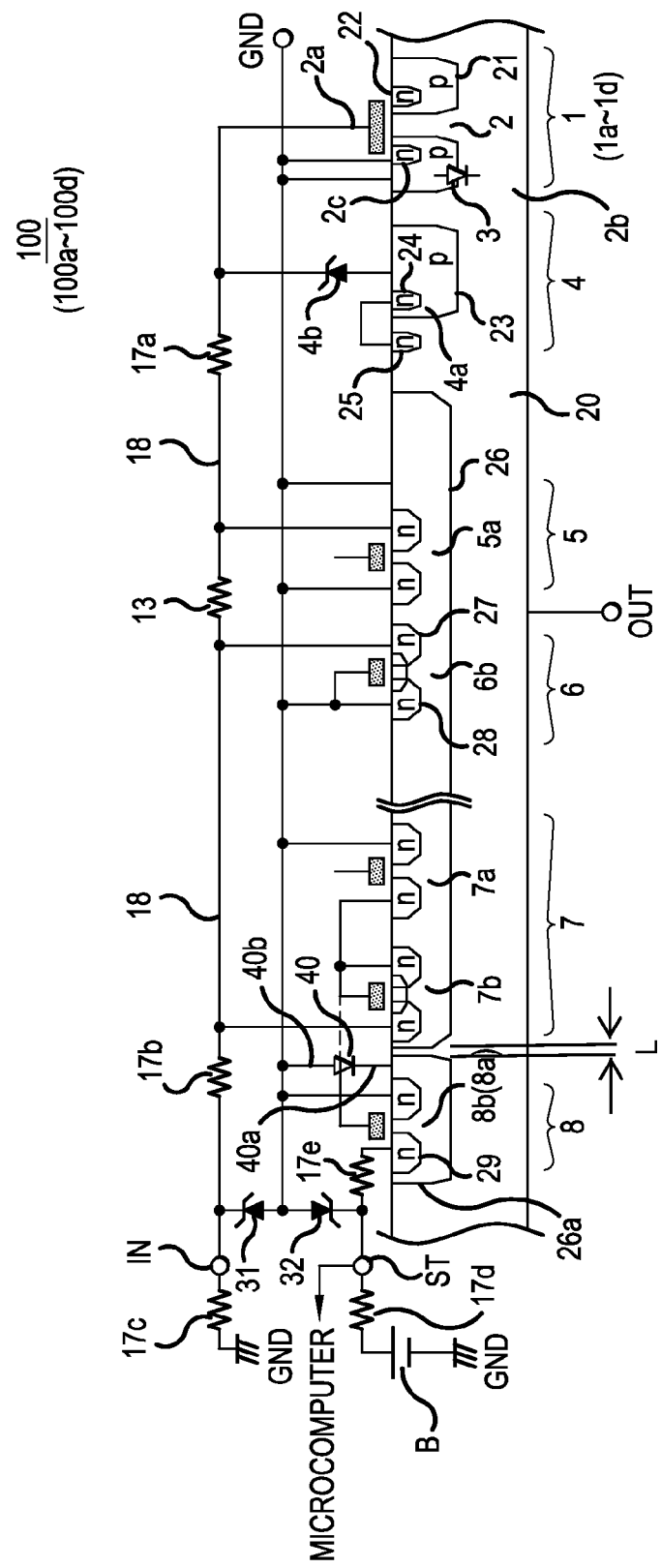
FIG. 2 is a cross sectional view showing the principal part of a semiconductor device 100 according to an embodiment of the invention.

FIG. 2 is a cross sectional view showing the principal part of a semiconductor device 100 according to an embodiment of the invention. The control circuit 101 shown in FIG. 1 is formed on the surface of the same n-type semiconductor substrate 20. A battery B forming the control circuit 101 is externally provided. The semiconductor device 100 represents each of the semiconductor device 100a, semiconductor device 100b, semiconductor device 100c, and semiconductor device 100d provided in the first arm EGR1, second arm EGR2, third arm EGR3, and fourth arm EGR4, respectively.

The semiconductor device 100 is provided with the vertical output stage nMOSFET 1. The semiconductor device 100 is provided with a plurality of p-type well regions 21, 23, 26, and 26a formed in the surface layer of the n-type semiconductor substrate 20. The semiconductor device 100 is further provided with the logic circuit 7, the overheat detection circuit 9 (not shown), and overcurrent detection circuit 10 (not shown), which are formed on the surface layer of the p-type well region 26 as one of a plurality of the foregoing p-type well regions. In the surface layer of the p-type well region 26, the lateral nMOSFET 5a in the gate charge extracting circuit at protecting operation 5 and the gate charge extracting circuit at normal operation 6 are further provided.

In the surface layer of the p-type well region 26a forming the ST-MOS circuit 8, the lateral nMOSFETs 8a and 8b are provided. The p-type well region 26a is connected to a cathode 40a of the voltage dividing diode 40, an anode 40b of which is connected to the GND terminal. The p-type well region 26a becomes the back gate common to the lateral nMOSFETs 8a and 8b.

As an $n^+$-type region connected to the GND wiring, an n-type source region 22 (source 2c) of the output stage nMOSFET 1 is provided in the surface layer of the p-type well region 21 as another one of the p-type well regions. Further, an n-type cathode region 24 of the Zener diode 4a (formed in the n-type semiconductor substrate 20) forming the dynamic clamp Zener diode 4 is provided in the surface layer of the p-type well region 23 as the remaining one of the p-type well regions. The cathode of the Zener diode 4b of the dynamic clamp Zener diode 4 is connected to the IN terminal through a resistor 17a, the resistor 13, and a resistor 17b. The IN terminal is connected to the ground GND through a resistor 17c. In addition, an $n^+$-type region 25 is provided in the surface layer of the n-type semiconductor substrate 20 and is connected to the ground GND.

The ST terminal (ST) is connected to an n-type drain region 29 of the lateral nMOSFET 8b, formed in the p-type well region 26a to form the ST-MOS circuit 8, through a resistor 17e. In addition, the ST terminal is connected to a high potential side terminal of the battery B, and the low potential side terminal of the battery B is connected to the ground GND. The IN terminal (IN) is connected to the gate 2a of the output stage nMOSFET 1 through the resistors 17b, 13, and 17a by gate wiring 18. The ST terminal is further connected to a microcomputer for processing a broken wire detection signal or an abnormal signal.

The OUT terminal (OUT) is connected to an electrode formed on the whole bottom surface of the n-type semiconductor substrate 20. The electrode formed on the whole bottom surface of the n-type semiconductor substrate 20 becomes the drain electrode of the output stage nMOSFET 1.

The GND terminal (GND) is connected to the n-type source region (shown without reference numeral) of the lateral nMOSFET 5a forming the gate charge extracting circuit at protecting operation 5. The GND terminal (GND) is further connected to an n-type source region 28 of the depletion MOSFET 6b to be the constant current source 6a forming the gate charge extracting circuit at normal operation 6, and to the n-type source region (shown without reference numeral) of a lateral nMOSFET 7a in the logic circuit 7. Moreover, each of an n-type source region (shown without reference numeral) of the lateral nMOSFET 8b (8a) and the p-type well region 26 is connected to the GND terminal.

In addition, the n-type drain region (shown without reference numeral) of the lateral nMOSFET 5a and the n-type drain region 27 of the depletion MOSFET 6b are connected to the gate wiring 18. Moreover, a Zener diode 31, which is connected between the IN terminal and the GND terminal, and a Zener diode 32, which is connected between the GND terminal and the ST terminal, are provided for surge protection.

Both of the p-type well region 21 and the n-type source region 22 (source 2c) of the output stage nMOSFET 1 are also connected to the GND terminal. With the p-type well region 21 and the n-type semiconductor substrate 20, the parasitic diode section 3 of the output stage nMOSFET 1 is formed.

The p-type well region 26 and the p-type well region 26a, with the spacing L between them increased to more than the diffusion length of holes injected from the p-type well region 26 into the n-type semiconductor substrate 20, can be electrically isolated with the MOSFETs formed in their respective regions hardly causing interference with each other. For example, the spacing L between the p-type well region 26 and the p-type well region 26a may be on the order of 10 μm. For example, the spacing L may be equal to or more than 20 μm or may be equal to or more than 50 μm to cause no interference with each other. Moreover, since the diffusion length of holes is approximately 100 μm or more, though it depends on the impurity concentration in the n-type semiconductor substrate 20, the spacing L may be equal to 100 μm or more to sufficiently inhibit the occurrence of the interference. While, too large spacing L will unfavorably cause a large chip size of the semiconductor device 100. Thus, the spacing L may be 500 μm or less, for example. That is, the spacing L may be in a range of 10 μm to 500 μm, such as for example, the ranges of 20 μm to 200 μm and 50 μm to 100 μm. Moreover, the spacing L can be in the range of 200 μm to 500 μm.

Figure 14:
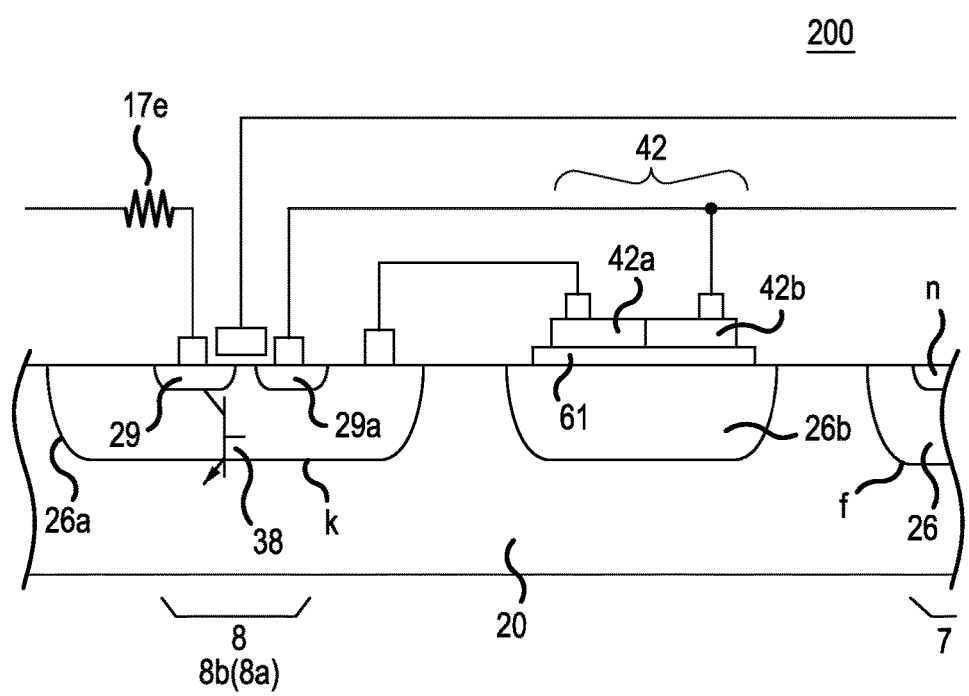
FIG. 14 is a cross sectional view showing the voltage dividing diode 40 according to an embodiment of the invention.

The voltage dividing diode 40 is a diode such as a Zener diode formed of polysilicon, for example, formed on the n-type semiconductor substrate 20 with an insulating film provided in between. FIG. 14 is a cross sectional view showing the voltage dividing diode 40 according to an embodiment of the invention. In the surface layer of the n-type semiconductor substrate 20, a p-type well region 26b is formed so as to be isolated from both of the p-type well region 26 and the p-type well region 26a. On the surface of the p-type well region 26b, an oxide film 61 is provided which is formed by a means such as thermal oxidation or chemical vapor deposition (CVD). On the surface of the oxide film 61, a polysilicon film is formed. By carrying out ion implantation with dopant ions into the polysilicon film and subsequent heat processing, a polysilicon diode 42 is formed as a Zener diode having an n-type cathode region 42a and a p-type anode region 42b. The polysilicon diode 42 is the voltage dividing diode 40. The n-type cathode region 42a of the voltage dividing diode 40 is electrically connected to the p-type well region 26a formed while being isolated from the p-type well region 26b. The p-type well region 26a is a back gate of each of the lateral nMOSFET 8a and the lateral nMOSFET 8b both forming the ST-MOS circuit 8. Each of the isolating distance between the p-type well region 26 and the p-type well region 26b and the isolating distance between the p-type well region 26a and the p-type well region 26b can be made to be equal to the foregoing spacing L between the p-type well region 26 and the p-type well region 26a.

When the breakdown voltage of the output stage nMOSFET is such a low voltage as being equal to 100V or less or equal to 300V or less, the p-type well region 26b can be omitted. While, when the breakdown voltage of the output stage nMOSFET is equal to 300V or more or when the output stage nMOSFET is a switching element with a high breakdown voltage equal to 600V or more such as an IGBT, the p-type well region 26b may be formed. When a switching element is a high breakdown voltage element, an element without p-type well region 26b sometimes causes a voltage in hundreds of volts to be applied between the polysilicon of the voltage dividing diode 40 and the surface of the n-type semiconductor substrate 20. At that time, there is a possibility of causing an applied voltage to exceed the dielectric breakdown voltage of the oxide film 61 to induce a dielectric breakdown. However, the p-type well region 26b formed beneath the polysilicon makes a depletion layer formed at the p-n junction between the p-type well region 26b and the n-type semiconductor substrate 20, by which no high voltage is applied to the oxide film to make it possible to prevent a dielectric breakdown.

All of the overheat detection circuit 9, the overcurrent detection circuit 10, the logic circuit 7, the gate charge extracting circuit at protecting operation 5, and the gate charge extracting circuit at normal operation 6 shown in FIG. 1 are formed in the p-type well region 26 shown in FIG. 2, each of which circuits is formed at a specified distance apart from other circuits to be self-isolated.

In FIG. 1, reference numeral 18 designates the gate wiring connecting the IN terminal and the gate 2a of the output stage nMOSFET 1, and reference numeral 19 designates the broken wire detection line.

Figure 3:
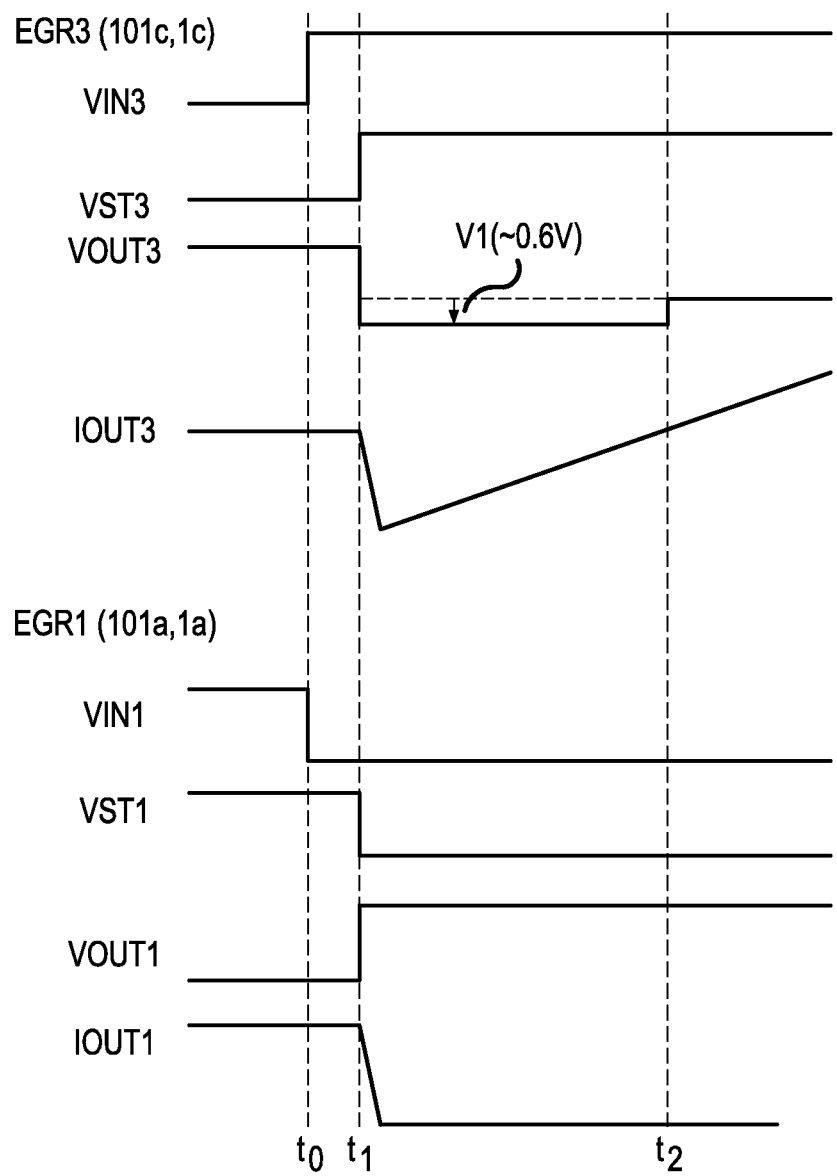
FIG. 3 is a waveform diagram showing the waveforms of the input voltage VIN3, a voltage VST3, a voltage VOUT3, and a current IOUT3 in the control circuit 101c of the third arm EGR3, and the waveforms of the input voltage VIN1, a voltage VST1, a voltage VOUT1, and a current IOUT1 in the control circuit 101a of the first arm EGR1.
Figure 7A:
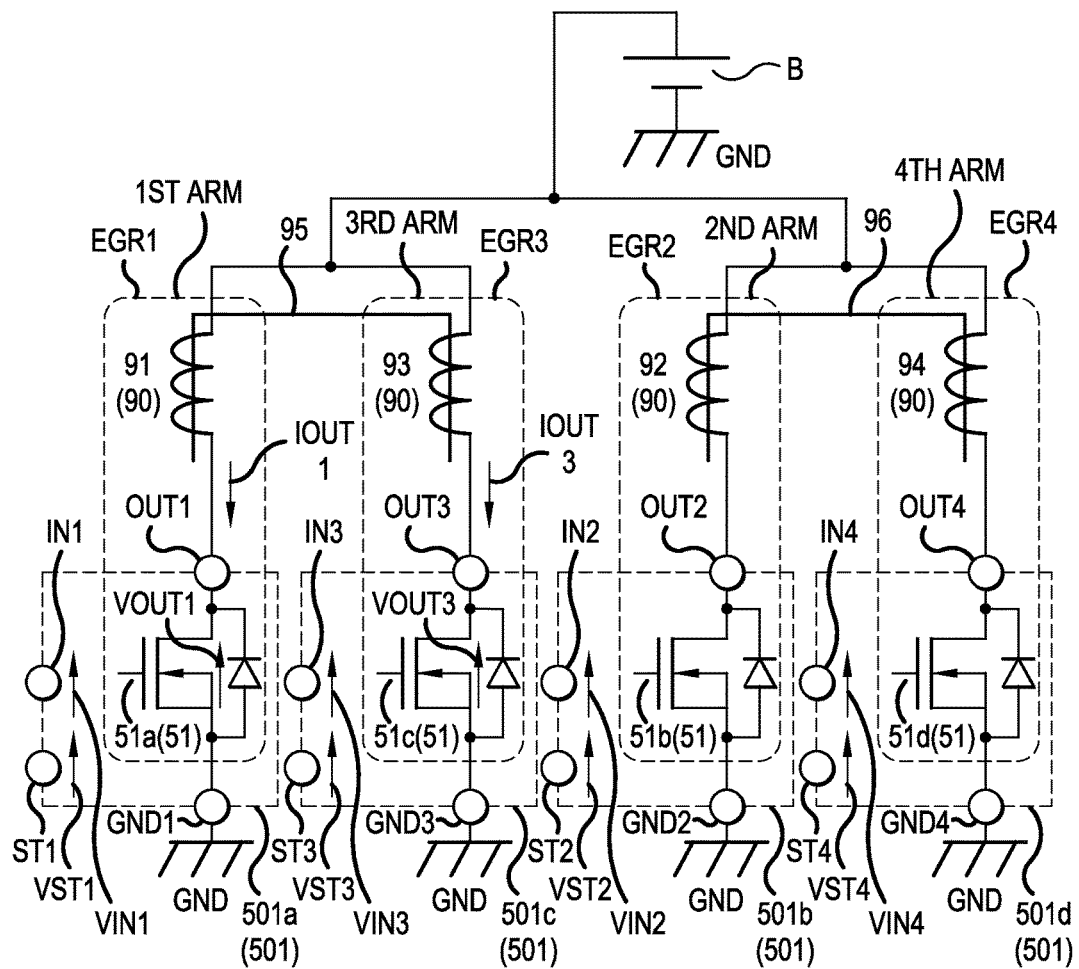
FIG. 7A is a diagram showing the whole configuration of the principal part of a stepping motor.
Figure 7B:
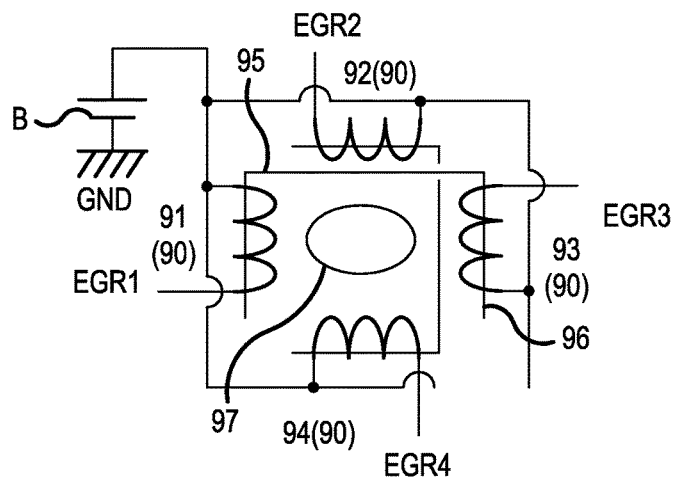
FIG. 7B is a diagram showing the arrangement of a rotor 97 and coils 90 of the stepping motor.
Figure 8:
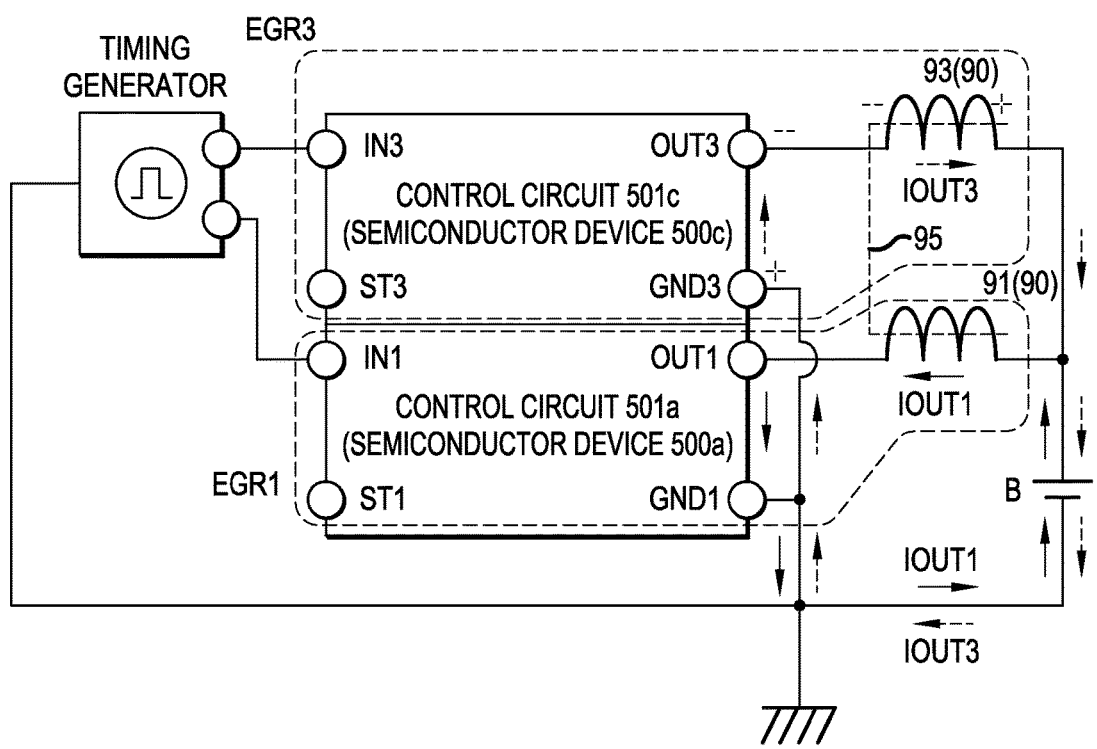
FIG. 8 is a block diagram showing the first arm EGR1 and the third arm EGR3 shown in FIG. 7A with the configurations thereof being made simplified.

FIG. 3 is a waveform diagram showing the waveforms of the input voltage VIN3, a voltage VST3, a voltage VOUT3, and a current IOUT3 in the control circuit 101c of the third arm EGR3 and the waveforms of the input voltage VIN1, a voltage VST1, a voltage VOUT1, and a current IOUT1 in the control circuit 101a of the first arm EGR1. The configurations of the third arm EGR3 and first arm EGR1 may be identical to those of the third arm EGR3 and first arm EGR1 shown in FIG. 7A, FIG. 7B, and FIG. 8. Here, the input voltages VIN 1 and VIN 3 are input voltages (also referred to as gate voltages or control voltages) inputted to the IN1 terminal and IN3 terminal as input terminals, respectively. The voltages VST1 and VST3 are voltages at the ST1 terminal and ST3 terminal as status terminals, respectively. The voltages VOUT1 and VOUT3 are voltages at the OUT1 terminal and OUT3 terminal as output terminals and are the drain voltages of the output stage nMOSFETs 1a and 1c, respectively. The currents IOUT1 and IOUT3 are drain currents flowing in the output stage nMOSFETs 1a and 1c, respectively. The currents IOUT1 and IOUT3 are also load currents flowing in the coils 91 and 93 (mutual-inductive loads) in the first arm EGR1 and third arm EGR3, respectively.

Figure 4A:
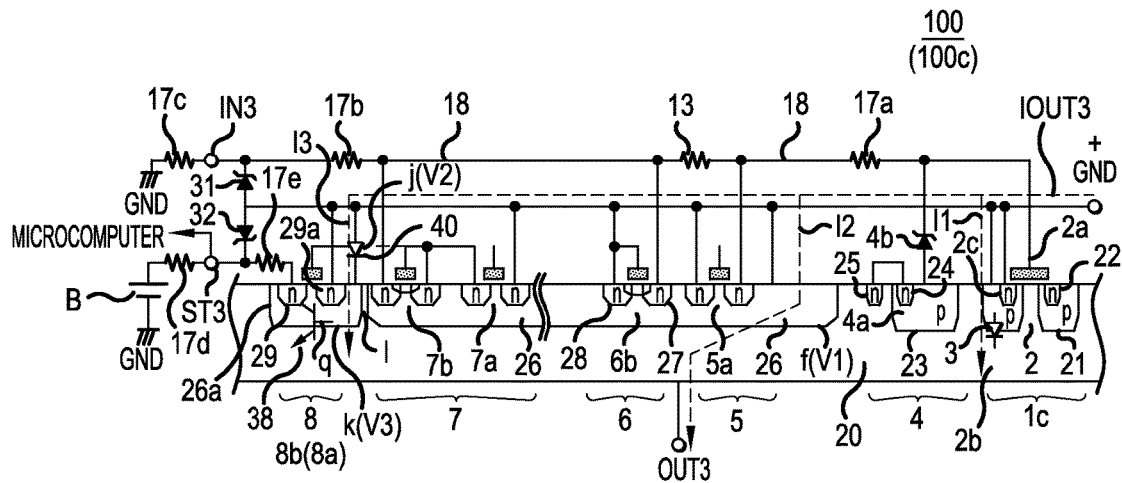
Figure 4B:
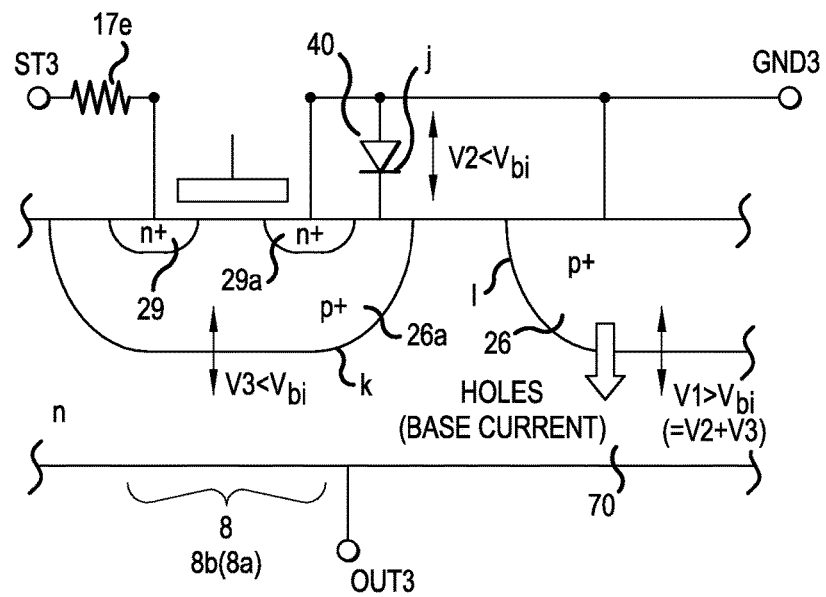
FIG. 4B is a cross sectional view schematically showing voltage sharing by the voltage dividing diode 40.

FIG. 4A is a cross sectional view of the semiconductor device 100c illustrating the case when the output stage nMOSFET 1a (equivalent to the output stage nMOSFET 51a shown in FIG. 7A) in the first arm EGR1 is turned-off and the output stage nMOSFET 1c (equivalent to the output stage nMOSFET 51c shown in FIG. 7A) in the third arm EGR3 is turned-on. FIG. 4B is a cross sectional view schematically showing voltage sharing by the voltage dividing diode 40.

As shown in FIG. 3, suppose that a turning-on signal is inputted as the input voltage VIN3 and a turning-off signal is inputted as the input voltage VIN1 at the time $t_0$. Then, the output stage nMOSFET 1a in the first arm EGR1 is made turned-off to bring the current IOUT1 to become zero at the time $t_1$ after a time delay due to the presence of a Miller capacitance and to bring the voltage VOUT1 to be the voltage of the battery B as a power supply voltage. At the time $t_1$ at which the state of the output stage nMOSFET 1a in the first arm EGR1 is changed from the turned-on state to the turned-off state, the state of the output stage nMOSFET 1c in the third arm EGR3 is shifted from the turned-off state to the turned-on state. This makes the voltage VOUT3 fall. In the process after the time $t_1$, due to the influence of the mutual inductance between the coil 93 in the third arm EGR3 and the coil 91 in the first arm EGR1, a current (reverse current) flows in the coil 93 (FIG. 7A) in the third arm EGR3 in the opposite direction from the ground GND toward the battery B. The reverse current lasts for a period determined by the value of the mutual inductance and thereafter, at the time $t_2$ at which the forward current exceeds the reverse current, the current flowing in the third arm EGR3 is switched to a current flowing from the battery B to the ground GND (forward current). The reverse current charges the battery B as a regenerative current.

In this way, in the mutual-inductive load (equivalent to the coil 93 shown in FIG. 7A) connected to the third arm EGR3, an induced electromotive force (counter electromotive force) is generated so that the polarity of the OUT3 terminal becomes negative and the polarity of the GND terminal becomes positive. The induced electromotive force causes the current IOUT3 to flow from the GND terminal toward the OUT3 terminal as is shown in FIG. 4A. The current IOUT3 is divided into a current I1 flowing in the parasitic diode section 3 in the output stage nMOSFET 1c (equivalent to the output stage nMOSFET 51c in FIG. 7A), a current I2 flowing through the p-type well region 26, and a current I3 flowing through the voltage dividing diode 40.

As is explained in the foregoing, between time t1 and t2 in FIG. 3, at the p-n junction f between the p-type well region 26 and the n-type semiconductor substrate 20, a rising voltage V1 (related to the built-in potential difference) equivalent to the voltage drop at the p-n junction f is produced by the current I2 flowing from the GND terminal to the OUT3 terminal through the p-type well region 26. The rising voltage V1 is 0.6V to 0.7V, for example. While, the voltage dividing diode 40, connected to the GND terminal with the anode 40b, has a p-n junction j between the anode 40b and the cathode 40a. Moreover, as is shown in FIG. 4B, between the p-type well region 26a, connected in series to the cathode 40a of the voltage dividing diode 40, and the n-type semiconductor substrate 20, a p-n junction k is also formed. The rising voltage V1 is applied to the p-n junction j and to the p-n junction k.

The rising voltage V1 ($\approx$0.7V) is divided into a voltage V2 applied to the p-n junction j of the voltage dividing diode 40 and a voltage V3 applied to the p-n junction k between the p-type well region 26a and the n-type semiconductor substrate 20 (V1=V2+V3). Each of the voltages V2 and V3, though it depends on the voltage dividing ratio, becomes V2=V3$\approx$0.35V when letting the voltage V1 be equally divided, for example, where the voltages V1, V2 and V3 are forward voltages at the p-n junctions f, j and k, respectively. Each of the divided voltages V2 and V3 ($\approx$0.35V) applied to the p-n junctions j and k, respectively, becomes lower than the rising voltage (approximately 0.7V) applied to the whole of the p-n junction j and the p-n junction k regardless of the voltage dividing ratio. Hence, at each of the p-n junction j and the p-n junction k, only a considerably small current flows. That is, to the p-n junction k, a voltage lower than the rising voltage (approximately 0.7V) at the p-n junction f is applied to thereby make a parasitic transistor 38 not operated. This causes the ST-MOS circuit 8 not to malfunction to allow a normal signal to be inputted to the ST terminal.

The p-type well region 26a is a back gate common to both of the lateral nMOSFETs 8a and 8b. The back gate becomes the base q of the parasitic transistor 38. In order for the parasitic transistor 38 to be brought into a turned-on state, it is necessary to apply the voltage V3 of V3=0.7V to the p-n junction between the p-type well region 26a and the n-type semiconductor substrate 20. That is, it is necessary to apply a voltage of 0.7V to the base q. However, the voltage dividing diode 40, being connected to the back gate in series, only allows a voltage smaller than the voltage V1 to be applied to the base q. This allows the parasitic transistor 38 to be brought into no turning-on operation. As a result, even in the case in which the polarity of the OUT3 terminal becomes negative and the polarity of the GND3 terminal becomes positive, the influence on the voltage at the ST3 terminal is inhibited, by which the voltage at the ST3 terminal is kept at a normal voltage.

When the voltage dividing diode 40 is not formed of a single diode but is formed of a plurality of diodes connected in series, the voltage applied to the base q of the parasitic transistor 38 becomes further lower to make it further difficult for the parasitic transistor 38 to be brought into operation. However, an increase in number of the voltage dividing diodes 40 connected in series causes the state of the potential of the p-type well region 26a to be liable to be unstable. Thus, the number of the voltage dividing diodes 40 may be on the order of five or less.

Figure 5:
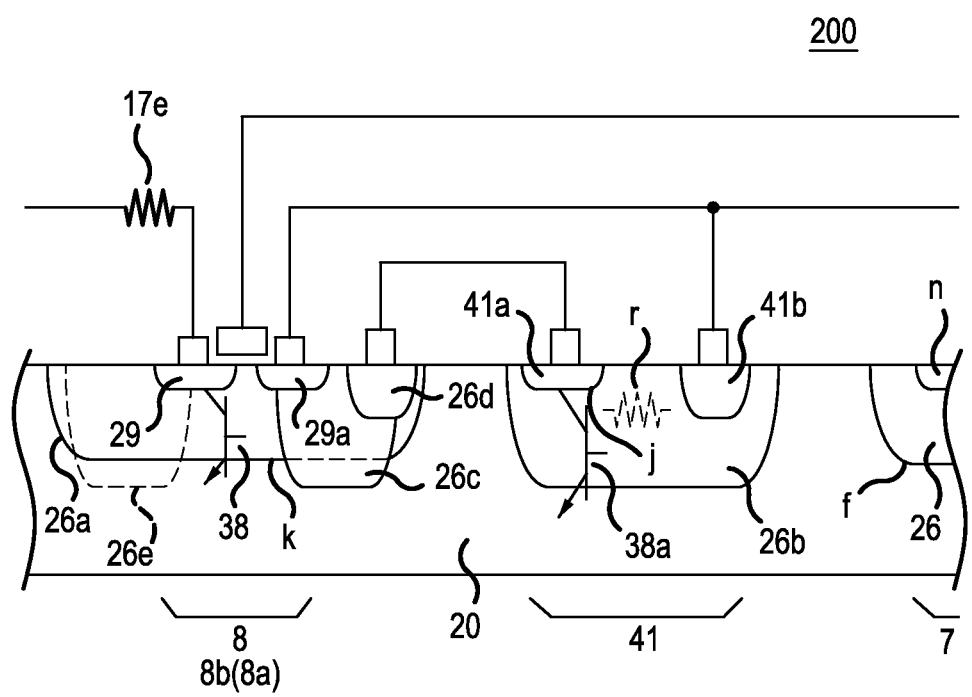
FIG. 5 is a cross sectional view showing the principal part of a semiconductor device 200 according to an embodiment of the invention.

FIG. 5 is a cross sectional view showing the principal part of a semiconductor device 200 according to an embodiment of the invention. The semiconductor device 200 differs from the semiconductor device 100 shown in FIG. 2 in that the voltage dividing diode 40 in the semiconductor device 100 is provided as a lateral diffused junction diode 41, which is formed in the n-type semiconductor substrate 20 by impurity diffusion.

In FIG. 5, the p-type well region 26b is newly provided between the p-type well region 26 and the p-type well region 26a. The impurity concentration in the p-type well region 26b is made to be higher than those in the p-type well region 26 and the p-type well region 26a. In the p-type well region 26b having the high impurity concentration, the lateral diffused junction diode 41 is formed, which is equivalent to the voltage dividing diode 40 shown in FIG. 2. The lateral diffused junction diode 41 has an n-type cathode region 41a and a p-type anode region 41b.

In the p-type well region 26a, the lateral nMOSFET 8b (8a) is formed. Moreover, a p-type well region 26c is formed so as to overlap an n-type source region 29a of the lateral nMOSFET 8b (8a). The p-type well region 26c has a diffusion depth deeper than that of the p-type well region 26a and has a high impurity concentration on the same order of that in the p-type well region 26b. Furthermore, in the p-type well region 26c, a p-type contact region 26d with a high impurity concentration is formed apart from the n-type source region 29a. The p-type contact region 26d becomes the back gate of the lateral nMOSFET 8b (8a). The n-type cathode region 41a of the lateral diffused junction diode 41 and the p-type contact region 26d (back gate) are connected to each other.

Between the time t1 and t2 in FIG. 3, the voltage between the GND terminal and the OUT terminal becomes 0.7V as the voltage at the p-n junction f between the p-type well region 26 and the n-type semiconductor substrate 20. The voltage of 0.7V is divided at the p-n junction j in the lateral diffused junction diode 41 and at the p-n junction k between the p-type well region 26a and the n-type semiconductor substrate 20, by which the voltage between the p-type well region 26a and the OUT terminal (equivalent to the voltage V3) becomes 0.35V, for example. The p-type well region 26a becomes the base q of the parasitic transistor 38. With the voltage applied between the base q and the OUT terminal being 0.35V, the parasitic transistor 38 is not brought into a turned-on state. As a result, like in the semiconductor device 100, the voltage at the ST terminal can be reliably maintained at a normal voltage.

The reason for making the impurity concentrations higher in the p-type well region 26b and 26c is as follows. The higher impurity concentration makes the rising voltage at each of the p-n junction between the p-type well region 26b and the n-type semiconductor substrate 20 and the p-n junction between the p-type well region 26c and the n-type semiconductor substrate 20 higher than the rising voltage at the p-n junction k between the p-type well region 26a and the n-type semiconductor substrate 20. This can inhibit a current flowing from each of the p-type well region 26b and the p-type well region 26c to the n-type semiconductor substrate 20. Moreover, a parasitic transistor 38a can be made to be hardly turned-on, which is formed of the n-type cathode region 41a of the lateral diffused junction diode 41, the p-type well region 26b and the n-type semiconductor substrate 20.

Furthermore, a p-type well region 26e formed also on the side of the n-type drain region 29 in the lateral nMOSFET 8b (8a) as is shown by a dotted line in FIG. 5 with an impurity concentration equal to that of the p-type well region 26c, reduces the area of the parasitic transistor 38 to make the parasitic transistor 38 further hardly turned-on.

The distance between the p-type well regions 26b and 26c may also be the distance on the same order of the distance L between the p-type well regions 26 and 26a described above.

Figure 6:
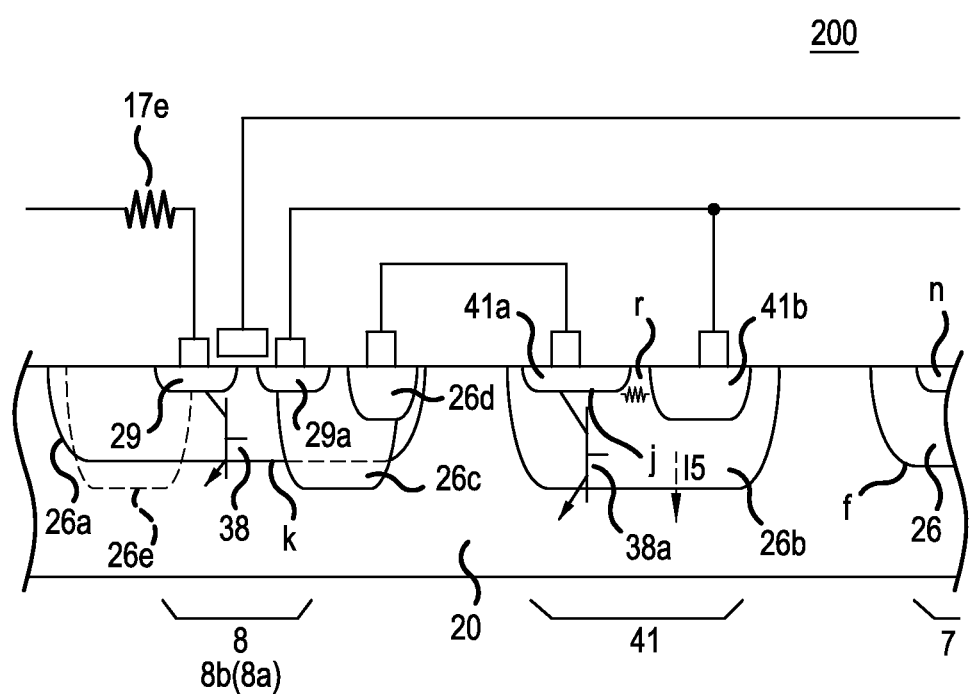
FIG. 6 is a cross sectional view showing the principal part of an example of a modified semiconductor device according to an embodiment of the invention.

FIG. 6 is a cross sectional view showing the principal part of an example of a modification of the semiconductor device 200. As is further shown in FIG. 6, by bringing the p-type anode region 41b and the n-type cathode region 41a of the lateral diffused junction diode 41 into contact with each other or into close proximity to each other, the lateral resistance r of the lateral diffused junction diode 41 shown in FIG. 5 is reduced. This can decrease a current passing from the p-type well region 26b to the n-type semiconductor substrate 20. As a result, from the n-type cathode region 41a of the lateral diffused junction diode 41, the divided voltage at the n-type cathode region 41a can be reliably transmitted to the p-type well region 26a to be the back gate of the lateral nMOSFET 8b (8a), by which the parasitic transistor 38a can be made to be hardly turned-on.

While the present invention has been particularly shown and described with reference to embodiments thereof, it will be understood by those skilled in the art that the foregoing and other changes in form and details can be made therein without departing from the spirit and scope of the present invention.

What is claimed is:

1. A semiconductor device comprising:
an output stage switching element configured to control a current in a load having a mutual inductance;
a detection circuit configured to detect an abnormality of the output stage switching element;
a logic circuit configured to make a determination with respect to a state of the output stage switching element using an output of the detection circuit;
a status detection circuit configured to output a status of a connection between the load and the output stage switching element and a result of the determination made by the logic circuit to a state outputting terminal; and
a voltage dividing diode connected in series to the status detection circuit, a cathode of the voltage dividing diode being connected to the status detection circuit, and an anode of the voltage dividing diode being connected to a ground,
wherein:
a first potential side of the output stage switching element is connected to an output terminal of a control circuit of the semiconductor device,
a first end of the load is connected to the output terminal, and a second end of the load is connected to a first potential side of a power supply, a second potential side of the power supply being connected to the ground,
the output stage switching element is formed in a semiconductor layer of a second conduction type with the semiconductor layer taken as being on the first potential side of the output stage switching element,
the detection circuit and the logic circuit are formed in a first well region of a first conduction type in the semiconductor layer,
the status detection circuit comprises a lateral MOSFET of the second conduction type formed in a second well region of the first conduction type, the second well region being formed in the semiconductor layer at a distance from the first well region of the first conduction type,
each of the first well region of the first conduction type and the second potential side of the output stage switching element is connected to the ground,
the second well region of the first conduction type forms a back gate of the lateral MOSFET of the second conduction type, the back gate having the cathode of the voltage dividing diode connected thereto to connect the second well region of the first conduction type to the ground through the anode of the voltage dividing diode, and
the semiconductor layer formed as being on the first potential side of the output stage switching element is connected to the first potential side of the power supply through the load connected to the output terminal of the control circuit.

2. The semiconductor device as claimed in claim 1, wherein a fourth well region of the first conduction type is formed in the second well region so as to overlap at least a source region of regions forming the lateral MOSFET of the second conduction type forming the status detection circuit formed in the second well region of the first conduction type, the fourth well region having a diffusion depth greater than that of the second well region and an impurity concentration higher than that in the second well region, and being connected to the cathode of the voltage dividing diode.

3. The semiconductor device as claimed in claim 1, wherein:
the voltage dividing diode is a lateral diffused junction diode, and
the lateral diffused junction diode is formed in a third well region of the first conduction type formed with a depth greater than a diffused depth of the first well region, with an impurity concentration higher than that in the first well region, and at a distance apart from the first well region and the second well region.

4. The semiconductor device as claimed in claim 1, wherein a forward bias voltage applied to a first p-n junction between the first well region and the semiconductor layer is equal to a sum of a voltage applied to a second p-n junction in the voltage dividing diode and a voltage applied to a third p-n junction between the second well region and the semiconductor layer.

5. The semiconductor device as claimed in claim 4, wherein the voltage applied to the second p-n junction is smaller than the built-in voltage at the second p-n junction.

6. The semiconductor device as claimed in claim 4, wherein the voltage applied to the third p-n junction is smaller than the built-in voltage at the third p-n junction.

7. The semiconductor device as claimed in claim 1, wherein an isolation distance between the first well region and the second well region is in a range of 10 μm to 500 μm.

8. The semiconductor device as claimed in claim 1, wherein the voltage dividing diode is disposed on an oxide film disposed on the semiconductor layer.

9. The semiconductor system as claimed in claim 8, wherein the oxide film is formed on a third well region of the first conduction type formed in the semiconductor layer so as to be isolated from both of the first well region and the second well region.

10. The semiconductor device as claimed in claim 9, wherein each of an isolation distance between the first well region and the third well region and an isolation distance between the second well region and the third well region is in a range of 10 μm to 500 μm.

11. The semiconductor device as claimed in claim 9, wherein an isolation distance between the second well region and the third well region is longer than the diffusion length of minor carriers injected from the first well region to the semiconductor layer.

12. The semiconductor device as claimed in claim 8, wherein the voltage dividing diode comprises polysilicon.

13. The semiconductor device as claimed in claim 1, wherein an isolation distance between the first well region and the second well region is longer than a diffusion length of minor carriers injected from the first well region to the semiconductor layer.

14. The semiconductor device as claimed in claim 1, wherein the output stage switching element is a vertical MOSFET of the second conduction type.

* * * * *